United States Patent
Po et al.

(10) Patent No.: US 7,541,280 B2
(45) Date of Patent: Jun. 2, 2009

(54) METHOD OF FOMING A MICROMECHANICAL STRUCTURE

(75) Inventors: Ching-Heng Po, Miaoli County (TW); Shen-Ping Wang, Keelung (TW); Chia-Chiang Chen, Shin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 465 days.

(21) Appl. No.: 10/917,362

(22) Filed: Aug. 13, 2004

(65) Prior Publication Data

US 2006/0035439 A1    Feb. 16, 2006

(51) Int. Cl.
*H01L 21/4763* (2006.01)
*H01L 21/44* (2006.01)

(52) U.S. Cl. .............. 438/628; 438/644; 438/682; 257/E21.13; 257/E21.16

(58) Field of Classification Search .......... 438/628, 438/644, 682; 257/E21.13, E21.16
See application file for complete search history.

(56) References Cited

U.S. PATENT DOCUMENTS

| 5,421,974 | A | * | 6/1995 | Witt | 438/565 |
|---|---|---|---|---|---|
| 5,835,256 | A | | 11/1998 | Huibers | |
| 5,972,765 | A | * | 10/1999 | Clark et al. | 438/308 |
| 6,290,864 | B1 | | 9/2001 | Patel et al. | |
| 6,356,378 | B1 | | 3/2002 | Huibers | |
| 6,396,619 | B1 | | 5/2002 | Huibers et al. | |
| 6,529,310 | B1 | | 3/2003 | Huibers et al. | |
| 6,551,928 | B2 | * | 4/2003 | Wu | 438/683 |

* cited by examiner

*Primary Examiner*—Alexander G Ghyka
*Assistant Examiner*—Leonard Chang
(74) *Attorney, Agent, or Firm*—Birch, Stewart, Kolasch & Birch, LLP

(57) ABSTRACT

A method of forming a micromechanical structure, wherein at least one micromechanical structural layer is provided above a substrate. The micromechanical structural layer is sustained between a lower sacrificial silicon layer and an upper sacrificial silicon layer, wherein a metal silicide layer is formed between the lower and upper sacrificial silicon layers to increase interface adhesion therebetween. The upper sacrificial silicon layer, the metal silicide layer and the lower sacrificial silicon layer are then removed to release the micromechanical structural layer.

24 Claims, 10 Drawing Sheets

METHOD OF FOMING A MICROMECHANICAL STRUCTURE

BACKGROUND OF THE INVENTION

1. Field of the Invention

The present invention relates to a method of forming a micromechanical structure, and more particularly, to a method of preventing peeling between sacrificial silicon layers in the microelectromechanical structure (MEMS) process.

2. Brief Description of the Related Art

The use of silane ($SiH_4$) as a main reaction gas to deposit sacrificial silicon layers is a common step in the manufacture of semiconductor devices and MEMS. MEMS have found applications in inertial measurement, pressure sensing, thermal measurement, micro-fluidics, optics, and radio frequency communications, and the range of applications for these structures continues to grow. One example of such a structure is a reflective spatial light modulator, which is a device consisting of a planar array of electrostatically deflectable mirrors, each microscopic in size. The device is used as a microdisplay system for high resolution and large screen projection. The sacrificial silicon layer in such a device is the layer over which the mirror material is deposited. Once the mirror structure is formed, the sacrificial silicon layer is removed to leave gaps below the mirrors and microhinge along one edge of each mirror to join the mirror to the remainder of the structure. The gap and the microhinge provide the mirror with the freedom of movement needed for its deflection. Devices of this type are described in, for example, U.S. Pat. Nos. 6,356,378, 6,396,619 and 6,529,310.

The success of a manufacturing procedure for structures involving sacrificial silicon layers depends on the interface adhesion therebetween. The thickness and lateral dimensions of the layers, and in the case of the deflectable mirror structures, the width of the gap and the integrity of the microhinges, are all critical to achieve uniform microstructure properties and a high yield of defect-free product. One of the critical factors is the interface quality between the sacrificial silicon layers. Performance, uniformity and yield can all be improved with increases in the interface adhesion between the sacrificial silicon layers. Hereinafter, parts of a traditional micromirror structure process will be described, with reference to FIGS. 1A and 1B.

In FIG. 1A, a light transmissive glass substrate 100 is provided. A first sacrificial silicon layer 110 is deposited on the substrate 100. The first sacrificial silicon layer 110 is an amorphous silicon or crystalline silicon layer. A mirror plate 120 is then defined on part of the first sacrificial silicon layer 110. The mirror plate 120 can be a metal plate.

Referring to FIG. 1A, unwanted remnants (or byproducts) from the fabrication of the mirror plate 120 are then removed by argon (Ar) plasma cleaning (or sputtering) 130. Though effective, the Ar plasma cleaning 130 leaves remnant silicon dangling bonds on the surface of the first sacrificial silicon layer 110 exposing it to environmental and atmospheric impurities. The impurities again attach to the silicon dangling bonds on the surface of the first sacrificial silicon layer 110.

In FIG. 1B, a second sacrificial silicon layer 140 is deposited on the mirror plate 120 and the first sacrificial silicon layer 110. The second sacrificial silicon layer 110 is an amorphous silicon or crystalline silicon layer. It is noted that, since the surface of the first sacrificial silicon layer 110 has impurities, robust covalent (Si—Si) bonds at the interface between the first and second sacrificial silicon layers 110 and 140 cannot be thoroughly formed. That is, peeling 150 frequently occurs between the sacrificial silicon layers 110 and 140 after depositing the second sacrificial silicon layer 140. The peelings 150 cause the surface 141 on the second sacrificial silicon layer 140 to be rough, thereby affecting the subsequent photolithography and etching. In addition, the peeling issue will worsen with subsequent repeated thermal processes, thereby generating particles which contaminate other processing tools.

In U.S. Pat. No. 5,835,256, Huibers et al disclose a deflectable spatial light modulator (SLM). The method describes formation of silicon nitride or silicon dioxide mirror elements and the underlying polysilicon sacrificial layer serving as a support to be removed in subsequent etching. Nevertheless, the method does not eliminate the peeling issue in the sacrificial silicon layer.

In U.S. Pat. No. 6,396,619, Huibers et al disclose a deflectable spatial light modulator (SLM). The sacrificial material layer can be silicon or polymer. Nevertheless, the method does not teach how to solve the peeling issue of the sacrificial silicon layer.

In U.S. Pat. No. 6,290,864, Patel et al disclose a procedure of etching sacrificial silicon layers for the manufacture of MEMS. The method, utilizing noble gas fluorides or halogen fluorides as etchant gases, exhibits greater selectivity toward the silicon portion relative to other portions of the microstructure by incorporating non-etchant gaseous additives in the etchant gas. Nevertheless, this method does not eliminate peeling in the sacrificial silicon layer.

SUMMARY OF THE INVENTION

Embodiments of the invention provide a method of forming a micromechanical structure.

Embodiments of the invention further provide a method of preventing peeling between sacrificial silicon layers in a MEMS process.

Embodiments of the invention additionally provide a method of forming a micromirror structure.

In order to achieve these aims, embodiments of the invention provide a method of preventing peeling between two silicon layers. A first layer having a first silicon material is provided. An adhesive layer having a metal silicide material is formed on the first layer. A second layer having a second silicon material is formed on the metal silicide layer. The adhesive layer increases interface adhesion between the first and second layers Embodiments of the invention additionally provide a method of forming a micromirror structure. A first sacrificial silicon layer is formed on a substrate. A mirror plate is formed on part of the first sacrificial silicon layer. A metal silicide layer is formed on at least a surface of the first sacrificial silicon layer not covered by the mirror plate. A second sacrificial silicon layer is formed over the mirror plate and the metal silicide layer. At least one hole is formed to penetrate at least the second sacrificial silicon layer, the mirror plate and the first sacrificial silicon layer. The hole is filled with a conductive material to define a mirror support structure attached to the mirror plate and the substrate. The second sacrificial silicon layer, the metal silicide layer and the first sacrificial silicon layer are removed to release the mirror plate.

Embodiments of the invention additionally provide another method of forming a micromirror structure. A first sacrificial silicon layer is formed on a substrate. A mirror plate is formed on part of the first sacrificial layer. A metal silicide layer is formed at least on a surface of the first sacrificial silicon layer not covered by the mirror plate. A second sacrificial silicon layer is formed over the metal silicide layer and the mirror plate. The second sacrificial silicon layer, the metal silicide layer and the second sacrificial silicon layer are partially etched to create an opening exposing a portion of the mirror plate and at least one hole exposing a portion of the substrate. The opening and the hole are filled with a conductive material to define a mirror support structure attached to the mirror plate and the substrate. The second sacrificial silicon layer, the metal silicide layer and the second sacrificial silicon layer are removed to release the mirror plate.

Embodiments of the invention improve on the conventional technology in that the metal silicide layer, serving as an adhesive layer, is formed between the upper and lower sacrificial layers. Thus, the upper sacrificial silicon layer can be securely formed over the lower sacrificial silicon layer without peeling, thereby increasing manufacturing yield and ameliorating the disadvantages of the conventional technology.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
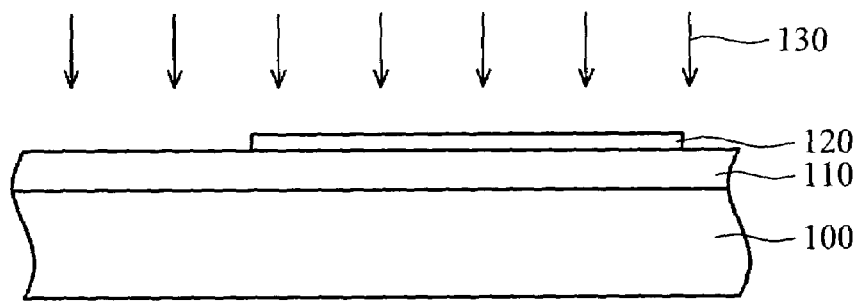
FIGS. 1A and 1B are cross-sectional views, according to parts of a conventional micromirror structure process.
Figure 1B:
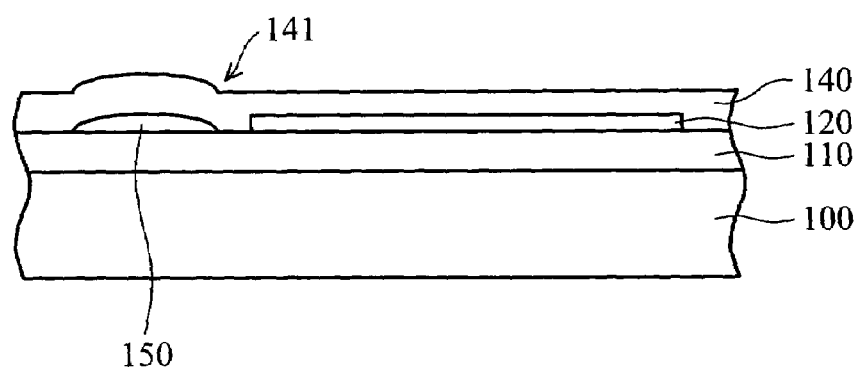

A silicon process proposed by embodiments of the invention, used to preventing peeling between two (lower and upper) sacrificial silicon layers in the fabrication of MEMS, comprises a metal silicide layer serving as an adhesive layer formed on a lower sacrificial silicon layer. By means of the metal silicide layer, the upper sacrificial silicon layer can be securely deposited over the lower sacrificial silicon layer without peeling. The lower sacrificial silicon layer comprises amorphous silicon or crystalline silicon formed by, for example, deposition. The upper sacrificial silicon layer comprises amorphous or crystalline silicon formed by, for example, deposition. The metal silicide layer can be $WSi_x$, $MoSi_x$, $TiSi_x$ or $CoSi_x$ formed by, for example, deposition or salicidation. For example, formation of the metal silicide layer of $WSi_x$ can be formed by CVD using $SiH_4$ and $WF_6$ as reaction gases. Selective formation of metal silicide, or salicide formation, on exposed surface comprising silicon is described in the following. A metal layer including a metallic material, such as titanium, tungsten, molybdenum or cobalt is formed over the lower sacrificial silicon layer. The metal layer is formed by, for example, direct-current (DC) sputtering deposition. An annealing procedure, using rapid thermal annealing (RTA) or conventional furnace annealing, is then performed to trigger a silicide reaction between silicon and the metallic material included in the metal layer.

The inventors find that metal silicide is more absorptive of Si atoms than other environmental and atmospheric impurities such as N and O ions during the metal silicide process. That is, the metal silicide layer serving as an adhesive layer substitutes Si-Metal bonds for Si dangling bonds on the surface of the lower sacrificial silicon layer before depositing the upper sacrificial silicon layer. Thus, the dangling Si bonds are resistant to atmospheric impurities, and have improved impurity absorption resistance on the interface of the lower sacrificial silicon layer. Since the reaction gas for depositing silicon is silane ($SiH_4$), the above Si-metal bonds can be securely combined with Si atoms during deposition (i.e. CVD). Therefore, the upper sacrificial silicon layer can be securely deposited over the lower sacrificial silicon layer by means of the metal silicide layer without peeling.

The present method is well suited for the MEMS process. A wide variety of MEMS devices can be made in accordance with embodiments of the invention, including microsensors, microvalves, micromirrors for optical scanning, microscopy, spectroscopy, maskless lithography, projection displays and optical switching, etc. The examples demonstrated below are micromirrors; however any of these or other MEMS devices can be made in accordance with the methods and materials of the invention.

First Embodiment

FIGS. 2A~2F are cross-sectional views of a first method of manufacturing a MEMS device according to this embodiment of the invention.

Figure 2A:
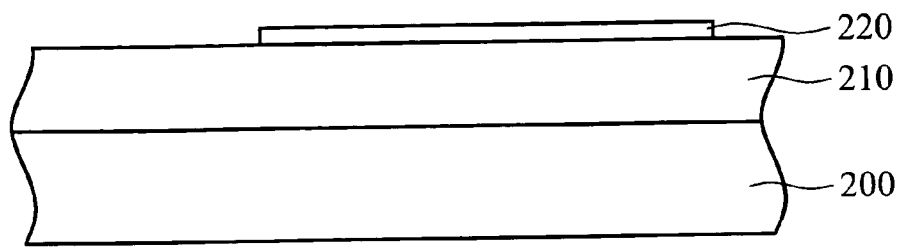
FIGS. 2A~2F are cross-sectional views, according to a first method of manufacturing a MEMS device of the invention.

In FIG. 2A, a substrate 200 is provided. The substrate 200 is a light transmissive substrate, such as glass or quartz. A first sacrificial silicon layer 210 is formed on the substrate 200. The first sacrificial silicon layer 210 is amorphous silicon or crystalline silicon deposited by plasma enhanced chemical vapor deposition (PECVD) or sputtering (physical vapor deposition of PVD). The thickness of the first sacrificial silicon layer 210 can be 5000~20000 Å. The amorphous silicon can additionally be annealed to increase stability.

A mirror plate 220 is then formed on the first sacrificial silicon layer 210. The mirror plate 220 can be a multilayer metal plate comprising an OMO (oxide-metal-oxide) structure. The metal can be Al, AlCu, AlSiCu and/or Ti formed by sputtering and patterning. The oxide can be $SiO_2$ formed by CVD. In this case, the mirror plate 220 is a reflective element deflectably coupled to the substrate 200. It should be noted that, in a typical SLM implementation in accordance with embodiments of the invention, an entire array of micromirrors is fabricated at the same time. For simplicity, formation of other mirror plates on the substrate 200 is not illustrated.

Figure 2B:
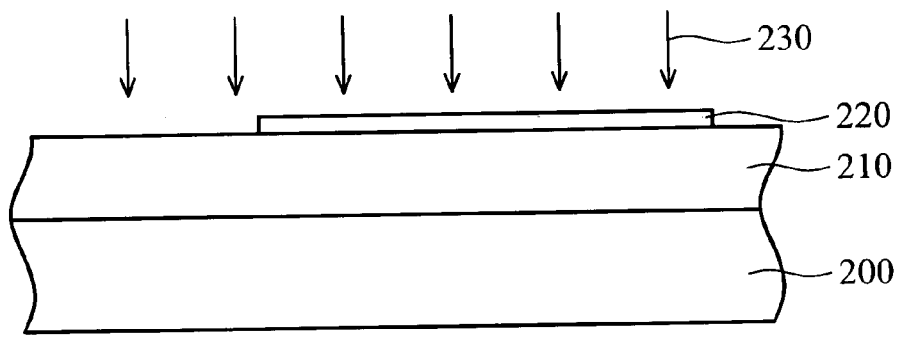

Referring to FIG. 2B, unwanted remnants (or referred to as byproducts) generated by the fabrication of the mirror plate 220, can be removed from the mirror plate 220 and the first sacrificial silicon layer 210 by an inert gas (e.g. Ar) plasma cleaning (or sputtering) procedure 230. Though effective, the Ar sputtering 230 leaves remnant silicon dangling bonds on the surface of the first sacrificial silicon layer 210 exposing it to environmental and atmospheric impurities. It should be noted that it is not essential to perform the Ar sputtering 230.

Figure 2C:
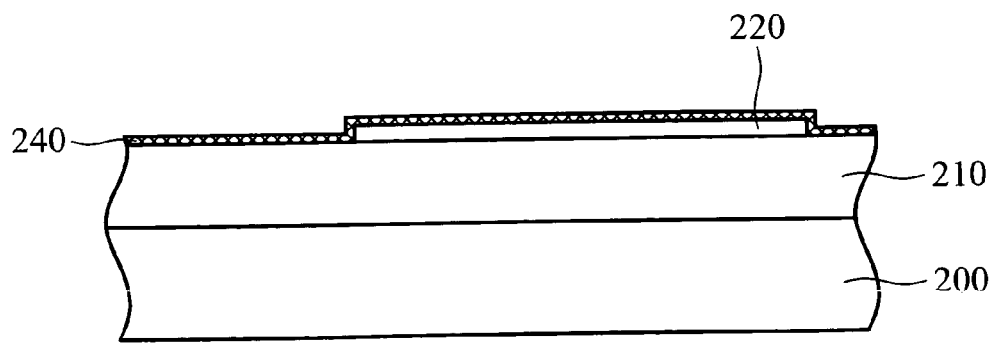

In FIG. 2C, a metal silicide layer 240 is formed on at least a surface of the first sacrificial silicon layer 210 not covered by the mirror plate 220. The metal silicide layer 240 comprises Si-Metal bonds that substitute for the Si dangling bonds, thereby improving the impurity absorption resistance on the interface of the first sacrificial silicon layer 210. The metal silicide layer 240 can be a $WSi_x$, $MoSi_x$, $TiSi_x$ or $CoSi_x$ layer formed by deposition or salicidation. For example, formation of the metal silicide layer 240 of $WSi_x$ is formed by CVD using $SiH_4$ and $WF_6$ as reaction gases. The thickness of the metal silicide layer 240 can be 300~700 Å, and preferably, 500 Å. In this case, a representative $WSi_x$ layer serving as the metal silicide layer 240 is thoroughly deposited on the first sacrificial silicon layer 210 and the mirror plate 220.

Figure 2D:
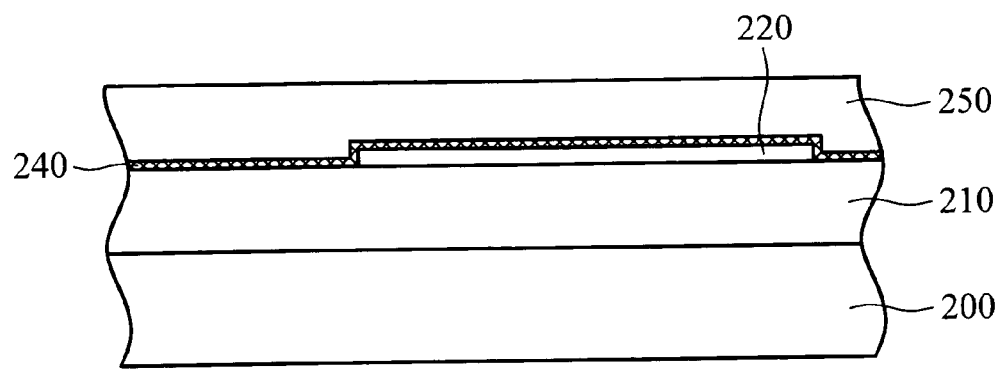

In FIG. 2D, a second sacrificial silicon layer 250 is formed over the metal silicide layer 240 and the mirror plate 220. The second sacrificial silicon layer 250 is amorphous silicon or crystalline silicon deposited by plasma enhanced chemical vapor deposition (PECVD). The thickness of the second sacrificial silicon layer 250 can be 2000~5000 Å. The amorphous silicon can additionally be annealed to increase stability. In this case, the reaction gas for depositing the second sacrificial silicon layer 250 is silane ($SiH_4$). The carrier gas can be Ar, He, $H_2$ or $N_2$. The above Si-Metal bonds are securely combined with Si atoms during this deposition. Therefore, the second sacrificial silicon layer 250 can be securely deposited over the first sacrificial silicon layer 210 without peeling.

Figure 2E:
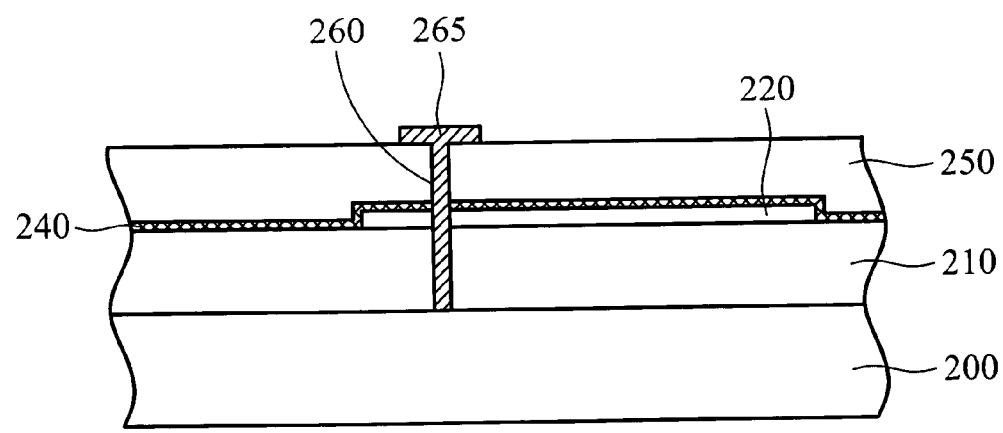

In FIG. 2E, at least one hole 260 penetrating the second sacrificial silicon layer 250, the metal silicide layer 240, the mirror plate 220 and the first sacrificial silicon layer 210 is formed. A conductive material is then deposited in the hole 260 to form a plug 265 serving as a mirror support structure 265 to attach the mirror plate 220 and the substrate 200. The conductive material is, f or example, W, Mo, Ti, Ta or a conductive metal compound. For some plug materials, it may be desirable to first deposit a liner (not shown) in order to avoid peeling (e.g., for a tungsten plug, a TiN, TiW or TiWN liner can be deposited to surround the tungsten in the hole in the sacrificial layers and subsequent to release of the sacrificial layers) It should be noted that, after the thermal processes for depositing the liner and the plug, there is no peeling between the first and second sacrificial silicon layers 210 and 250.

Figure 2F:
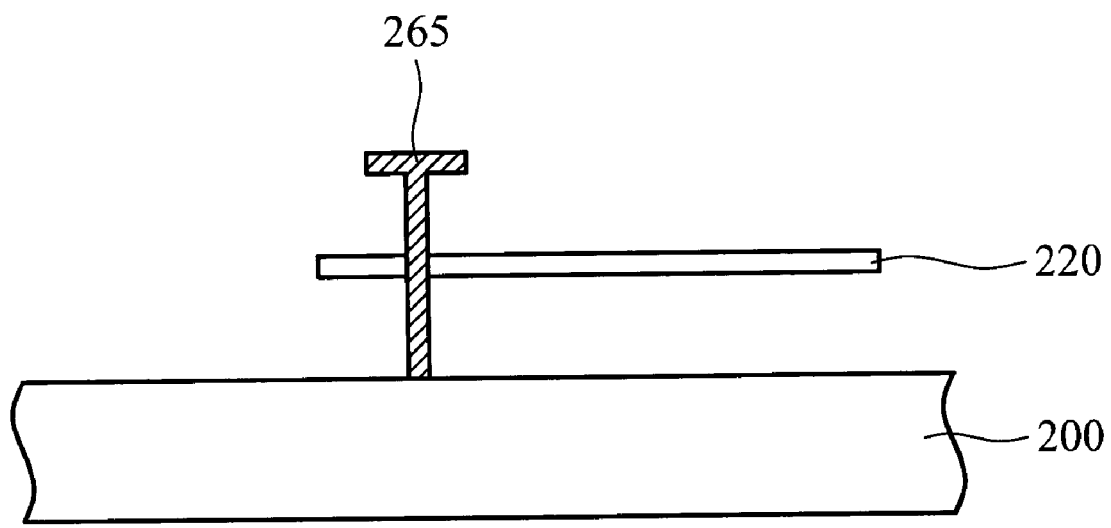

In FIG. 2F, the first sacrificial silicon layer 210, the metal silicide layer 240 and the second sacrificial silicon layer 250 are removed to release the mirror plate 220. This removal procedure can be implemented in a $XeF_2$ etcher. Thus, a mirror structure is obtained.

FIGS. 3A~3F are cross-sectional views, according to a modification of the first method of the invention. In the modification, the metal silicide layer is formed prior to formation of the mirror plate.

Figure 3A:
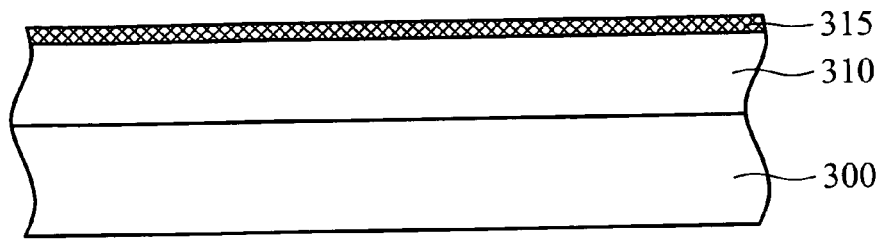
FIGS. 3A~3F are cross-sectional views, according to a modification of the first method of the invention.

In FIG. 3A, a substrate 300 is provided. The substrate 300 is a light transmissive substrate, such as glass or quartz. A first sacrificial silicon layer 310 is formed on the substrate 300. The first sacrificial silicon layer 310 is amorphous silicon or crystalline silicon deposited by plasma enhanced chemical vapor deposition (PECVD) or sputtering (physical vapor deposition of PVD). The thickness of the first sacrificial silicon layer 310 can be 5000~20000 Å. The amorphous silicon can additionally be annealed to increase stability.

A metal silicide layer 315 is then formed on the first sacrificial silicon layer 310. The metal silicide layer 315 improves the impurity absorption resistance on the interface of the first sacrificial silicon layer 310. The metal silicide layer 3150 can be a $WSi_x$, $MoSi_x$, $TiSi_x$ or $CoSi_x$ layer formed by deposition or salicidation. For example, formation of the metal silicide layer 315 of $WSi_x$ is formed by CVD using $SiH_4$ and $WF_6$ as reaction gases. The thickness of the metal silicide layer 315 can be 300~700 Å, and preferably, 500 Å. In this modification, a representative $WSi_x$ layer serving as the metal silicide layer 315 is thoroughly deposited on the first sacrificial silicon layer 310.

Figure 3B:
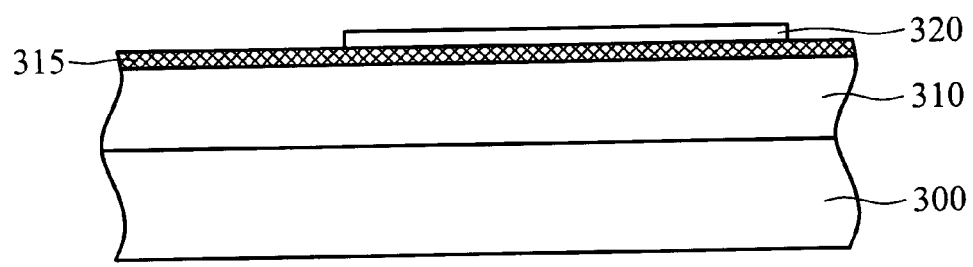

In FIG. 3B, a mirror plate 320 is formed on the metal silicide layer 315. The mirror plate 320 can be a multilayer metal plate comprising an OMO (oxide-metal-oxide) structure. The metal can be Al, AlCu, AlSiCu and/or Ti formed by sputtering and patterning. The oxide can be $SiO_2$ formed by CVD. In this example, the mirror plate 320 is a reflective element deflectably coupled to the substrate 300. It should be noted that, in a typical SLM implementation in accordance with embodiments of the invention, an entire array of micromirrors is fabricated at the same time. For simplicity, formation of other mirror plates on the substrate 300 is not illustrated.

Figure 3C:
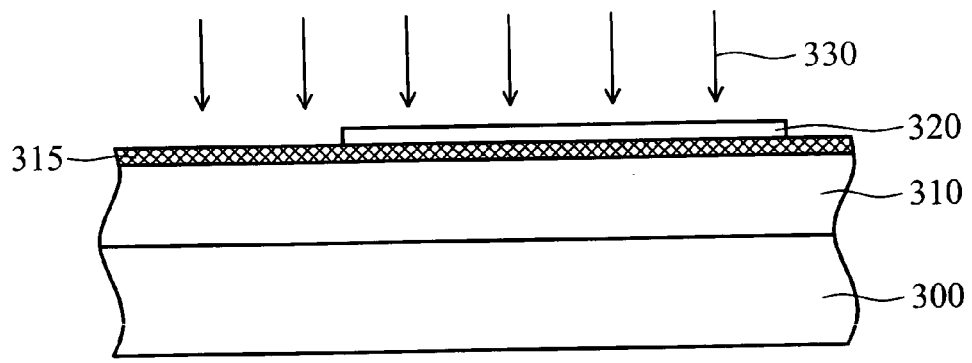

Referring to FIG. 3C, unwanted remnants (byproducts) generated by the fabrication of the mirror plate 320, can be removed from the mirror plate 320 and the metal silicide layer 315 by an inert gas (e.g. Ar) plasma cleaning (or sputtering) procedure 330. It should be noted that it is not essential to perform this Ar sputtering 330.

Figure 3D:
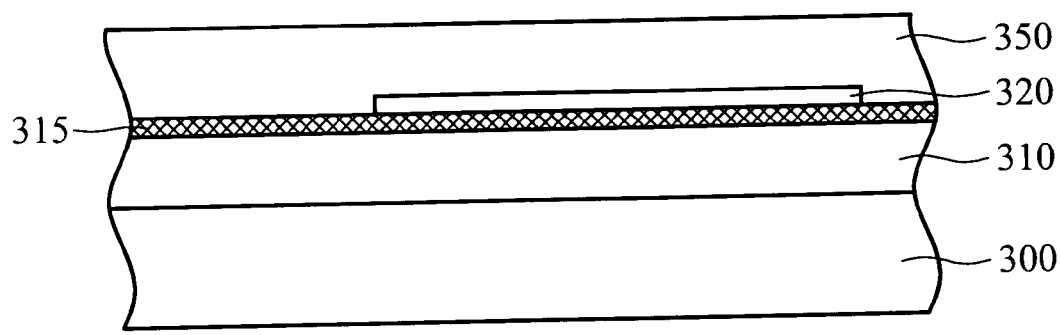

In FIG. 3D, a second sacrificial silicon layer 350 is formed over the metal silicide layer 315 and the mirror plate 320. The second sacrificial silicon layer 350 is amorphous silicon or crystalline silicon deposited by plasma enhanced chemical vapor deposition (PECVD). The thickness of the second sacrificial silicon layer 350 can be 2000~5000 Å. The amorphous silicon can additionally be annealed to increase stability. In this case, the reaction gas for depositing the second sacrificial silicon layer 350 is silane ($SiH_4$). The carrier gas can be Ar, He, $H_2$ or $N_2$. The Si-Metal bonds of the silicide layer 315 are securely combined with Si atoms during this deposition. Therefore, the second sacrificial silicon layer 350 can be securely deposited over the first sacrificial silicon layer 310 without peeling.

Figure 3E:
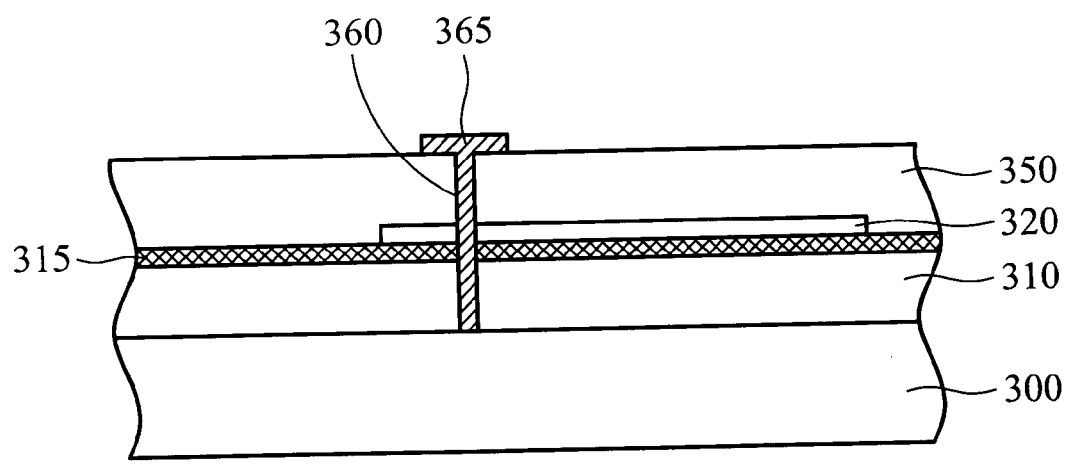

In FIG. 3E, at least one hole 360 penetrating the second sacrificial silicon layer 350, the mirror plate 320, the metal silicide layer 315, and the first sacrificial silicon layer 310 is formed. A conductive material is then deposited in the hole 360 to form a plug 365 serving as a mirror support structure 365 to attach the mirror plate 320 and the substrate 300. The conductive material is, for example, W, Mo, Ti, Ta or a conductive metal compound. For some plug materials, it may be desirable to first deposit a liner (not shown) in order to avoid peeling (e.g., for a tungsten plug, a TiN, TiW or TiWN liner can be deposited to surround the tungsten in the hole in the sacrificial layers and subsequent to release of the sacrificial layers) It should be noted that, after the thermal processes for depositing the liner and the plug, there is no peeling between the first and second sacrificial silicon layers 310 and 350.

Figure 3F:
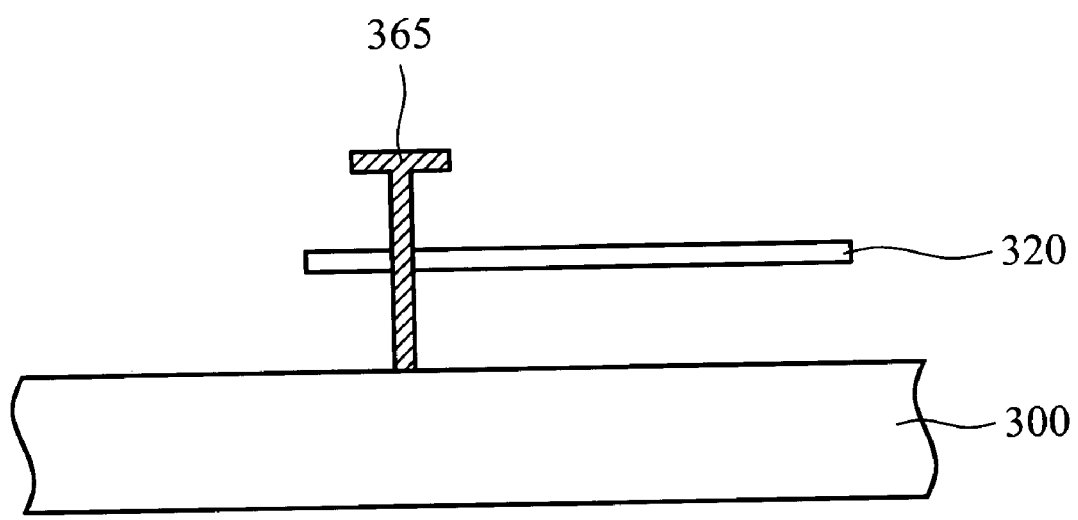

In FIG. 3F, the first sacrificial silicon layer 310, the metal silicide layer 315 and the second sacrificial silicon layer 350 are removed to release the mirror plate 320. This removal procedure can be implemented in a $XeF_2$ etcher. A mirror structure is thus obtained.

Second Embodiment

FIGS. 4A~4F illustrate perspective views of a portion of a substrate, according to a second method of manufacturing a MEMS device of this embodiment of the invention.

Figure 4A:
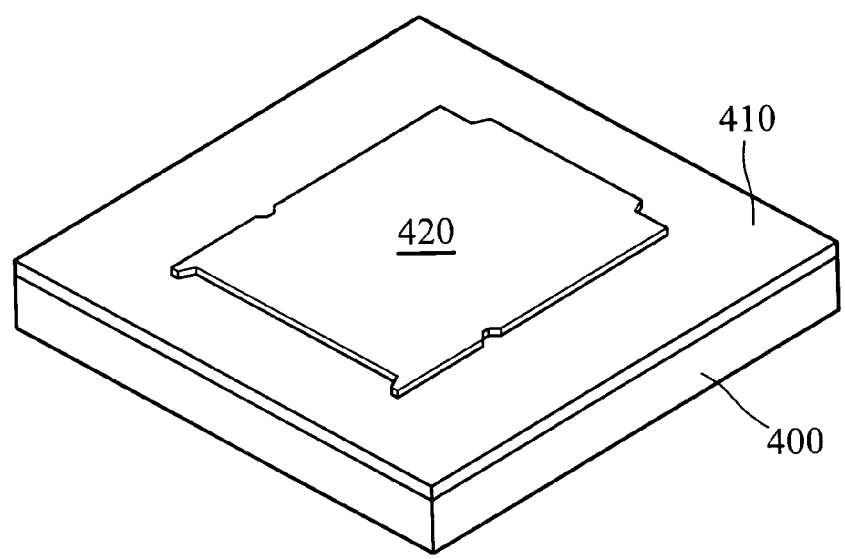
FIGS. 4A~4F illustrate perspective views of a portion of a substrate, according to a second method of manufacturing a MEMS device of the invention.

In FIG. 4A, a substrate 400 is provided. The substrate 400 is a light transmissive substrate, such as glass or quartz. A first sacrificial silicon layer 410 is formed on the substrate 400. The first sacrificial silicon layer 410 is amorphous silicon or crystalline silicon deposited by plasma enhanced chemical vapor deposition (PECVD) or sputtering (physical vapor deposition of PVD). The thickness of the first sacrificial silicon layer 410 can be 5000~20000 Å. The amorphous silicon can additionally be annealed to increase stability.

A mirror plate 420 is formed on the first sacrificial silicon layer 410. The mirror plate 420 can be a multilayer metal plate comprising an OMO (oxide-metal-oxide) structure. The metal can be Al, AlCu, AlSiCu and/or Ti formed by sputtering and patterning. The oxide can be $SiO_2$ formed by CVD. In this example, the mirror plate 420 is a reflective element deflectably coupled to the substrate 400. It is noted that, in a typical SLM implementation in accordance with embodiments of the invention, an entire array of micromirrors is fabricated at the same time. For simplicity, other mirror plates that are formed on the substrate 400 are not illustrated.

Figure 4B:
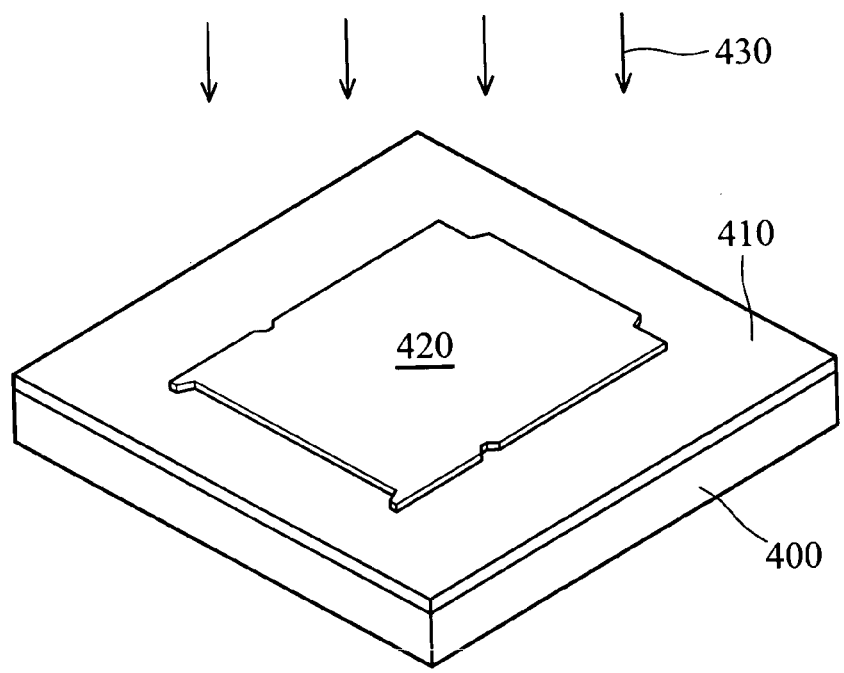

Referring to FIG. 4B, unwanted remnants (byproducts) generated by the fabrication of the mirror plate 420, can be removed from the mirror plate 420 and the first sacrificial silicon layer 410 by an inert gas (e.g. Ar) plasma cleaning (or sputtering) procedure 430. In this case, it is not essential to perform the Ar sputtering 430.

Figure 4C:
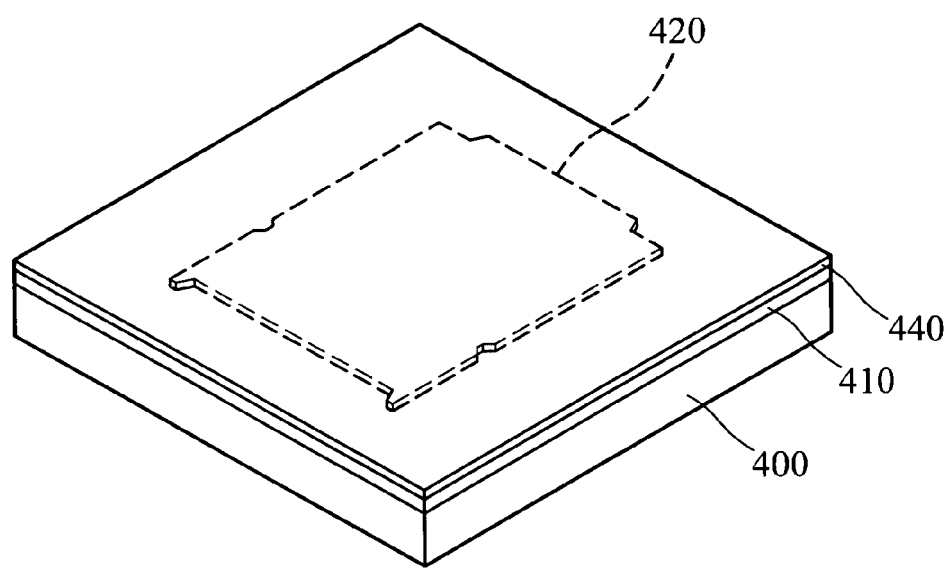

In FIG. 4C, a metal silicide layer 440 is formed at least on a surface 445 of the first sacrificial silicon layer 410 not covered by the mirror plate 420. The metal silicide layer 440 improves the impurity absorption resistance on the interface of the first sacrificial silicon layer 410. The metal silicide layer 440 can be a $WSi_x$, $MoSi_x$, $TiSi_x$ or $CoSi_x$ layer formed by deposition or salicidation. For example, formation of the metal silicide layer 440 of $WSi_x$ is formed by CVD using $SiH_4$ and $WF_6$ as reaction gases. The thickness of the metal silicide layer 440 can be 300~700 Å, and preferably, 500 Å. In this case, a representative $WSi_x$ layer serving as the metal silicide layer 440 is thoroughly deposited on the first sacrificial silicon layer 410 and the mirror plate 420.

It should be noted that, similar to the modification of the first embodiment, the metal silicide layer 440 can be formed prior to formation of the mirror plate 420. For simplicity, the modification of the second embodiment is not illustrated again.

A second sacrificial silicon layer 450 is then formed over the metal silicide layer 440 and the mirror plate 420. The second sacrificial silicon layer 450 is amorphous silicon or crystalline silicon deposited by plasma enhanced chemical vapor deposition (PECVD). The thickness of the second sacrificial silicon layer 450 can be 2000~5000 Å. The amorphous silicon can additionally be annealed to increase stability. In this embodiment, the reaction gas for depositing the second sacrificial silicon layer 450 is silane ($SiH_4$). The carrier gas can be Ar, He, $H_2$ or $N_2$. The Si-Metal bonds of the metal silicide layer 440 are securely combined with Si atoms during this deposition. Therefore, the second sacrificial silicon layer 450 can be securely deposited over the first sacrificial silicon layer 410 without peeling.

Figure 4D:
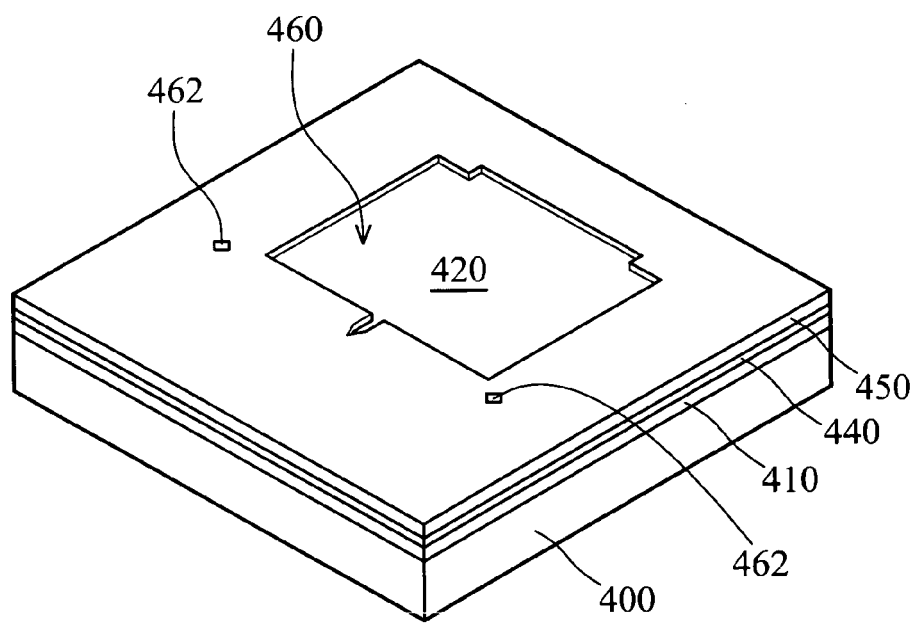

In FIG. 4D, the second sacrificial silicon layer 450, the metal silicide layer 440 and the first sacrificial silicon layer 410 are then partially etched to create an opening 460 exposing a portion of the mirror plate 420 and at least one hole 462 exposing a portion of the surface of the substrate 400.

Figure 4E:
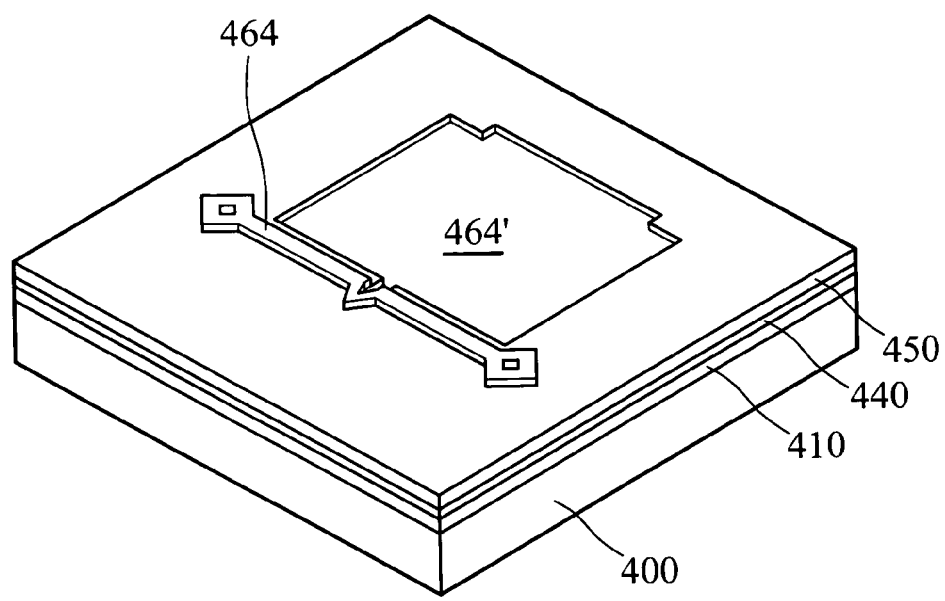

In FIG. 4E, a conductive material is deposited in the opening 460 and the hole 462 and is defined to form a mirror support structure 464 to attach the substrate 400. The conductive material is, for example, W, Mo, Ti, Ta or a conductive metal compound. The mirror support structure 464 as shown has an electrode portion 464' that is attached to the mirror plate 420, and a hinge support structure 464" (shown in FIG. 4F) attached to the substrate 400.

Figure 4F:
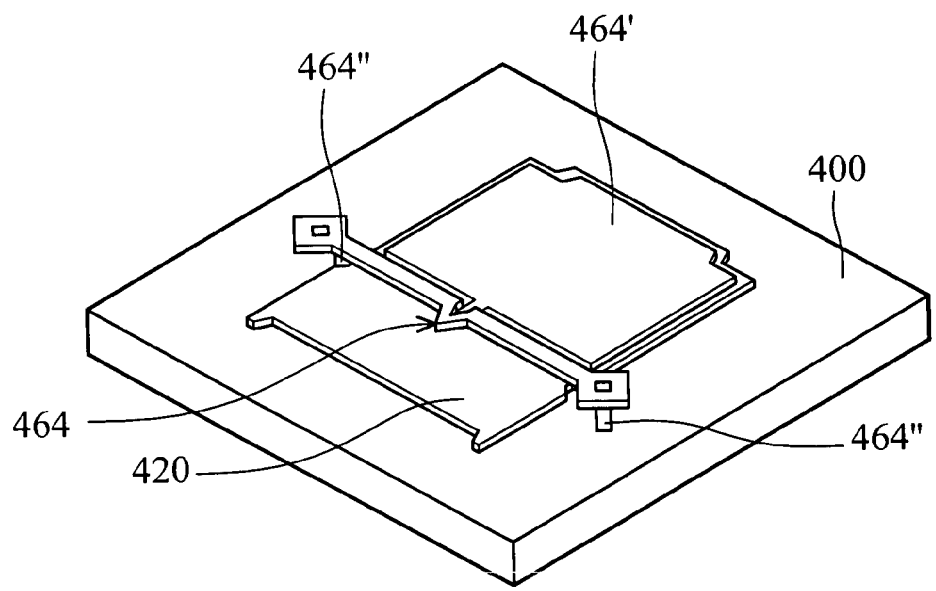

In FIG. 4F, the first sacrificial silicon layer 410, the metal silicide layer 440 and the second sacrificial silicon layer 450 are removed to release the mirror plate 420. This removal procedure can be implemented in a $XeF_2$ etcher. Thus, a mirror structure is obtained.

The resulting micromirror structure is ready to be sandwiched with a semiconductor substrate comprising electrodes and electronic circuitry therein to form a light valve device. The process for forming the semiconductor substrate for actuation of the micromirror structure is described in U.S. Pat. No. 5,835,256, and is therefore not discussed herein to avoid obscuring aspects of the invention.

Thus, the embodiments of the invention provide a method of preventing peeling between sacrificial silicon layers in the MEMS process. The present method employs the metal silicide layer, serving as an adhesive layer, formed between the upper and lower sacrificial layers. Thus, the upper sacrificial silicon layer can be securely formed over the lower sacrificial silicon layer without peeling, thereby increasing manufacturing yield, eliminating contamination and ameliorating the disadvantages of the conventional technology.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming a micromechanical structure, comprising the steps of:

providing at least one micromechanical structural layer above a substrate, wherein the micromechanical structural layer is sustained between a lower sacrificial silicon layer and an upper sacrificial silicon layer, and a metal silicide layer is formed between the lower and upper sacrificial silicon layers; and removing the upper sacrificial silicon layer, the metal silicide layer and the lower sacrificial silicon layer;

wherein the metal silicide layer increases interface adhesion between the lower and upper sacrificial silicon layers.

2. The method according to claim 1, wherein the lower sacrificial silicon layer is an amorphous silicon layer or crystalline silicon layer.

3. The method according to claim 1, wherein the upper sacrificial silicon layer is an amorphous silicon layer or crystalline silicon layer.

4. The method according to claim 1, wherein the metal silicide layer is a WSix, MoSix, TiSix or CoSix layer.

5. The method according to claim 1, wherein the upper sacrificial silicon layer, the metal silicide layer and the lower sacrificial silicon layer are removed by a XeF2 etcher.

6. A method of forming a micromirror structure, comprising the steps of:

forming a first sacrificial silicon layer on a substrate;

forming a minor plate on part of the first sacrificial silicon layer;

forming a metal suicide layer at least on a surface of the first sacrificial silicon layer not covered by the minor plate;

forming a second sacrificial silicon layer over the mirror plate and the metal silicide layer;

forming at least one hole penetrating at least the second sacrificial silicon layer, the mirror plate and the first sacrificial silicon layer;

filling a conductive material in the hole to define a minor support structure attached to the minor plate and the substrate; and removing the second sacrificial silicon layer, the metal silicide layer and the first sacrificial silicon layer to release the minor plate.

7. The method according to claim 6, wherein the first sacrificial silicon layer is an amorphous silicon layer or crystalline silicon layer.

8. The method according to claim 6, wherein the second sacrificial silicon layer is an amorphous silicon layer or crystalline silicon layer.

9. The method according to claim 6, wherein the metal silicide layer is a WSix, MoSix, TiSix or CoSix layer.

10. The method according to claim 6, wherein the upper sacrificial silicon layer, the metal silicide layer and the lower sacrificial silicon layer are removed by a XeF2 etcher.

11. the method according to claim 6, wherein the mirror plate is an OMO (oxide-metal-oxide) layer.

12. The method according to claim 6, wherein the conductive material comprises at least one of W, Mo, Ti and Ta.

13. A method for forming a micromirror structure, comprising the steps of:
  forming a first sacrificial silicon layer on a substrate;
  forming a mirror plate on part of the first sacrificial layer;
  forming a metal silicide layer at least on a surface of the first sacrificial silicon layer not covered by the mirror plate;
  forming a second sacrificial silicon layer over the metal silicide layer and the mirror plate;
  partially etching the second sacrificial silicon layer, the metal suicide layer and the second sacrificial silicon layer to create an opening exposing a portion of the mirror plate and at least one hole exposing a portion of the substrate;
  filling a conductive material in the opening and the hole to define a mirror support structure attached to the minor plate and the substrate; and
  removing the second sacrificial silicon layer, the metal silicide layer and the second sacrificial silicon layer to release the mirror plate.

14. The method according to claim 13, wherein the first sacrificial silicon layer is an amorphous silicon layer or crystalline silicon layer.

15. The method according to claim 13, wherein the second sacrificial silicon layer is an amorphous silicon layer or crystalline silicon layer.

16. The method according to claim 13, wherein the metal silicide layer is a WSix, MoSix, TiSix or CoSix layer.

17. The method according to claim 13, wherein the upper sacrificial silicon layer, the metal silicide layer and the lower sacrificial silicon layer are removed by a XeF2 etcher.

18. The method according to claim 6, wherein the metal suicide layer is formed after formation of the minor plate.

19. The method according to claim 6, wherein the metal suicide layer is formed prior to formation of the mirror plate.

20. The method according to claim 13, wherein the metal suicide layer is formed after formation of the minor plate.

21. The method according to claim 13, wherein the metal silicide layer is formed prior to formation of the mirror plate.

22. A method of preventing peeling between two silicon layers, comprising the steps of:
  providing a first layer comprising a first silicon material;
  performing an inert gas sputtering on the first layer;
  forming an adhesive layer comprising a metal silicide material on the first layer; and
  forming a second layer comprising a second silicon material on the metal silicide layer.

23. The method according to claim 22, wherein the first silicon material is amorphous silicon or crystalline silicon.

24. The method according to claim 22, wherein the metal suicide material is WSix, MoSix, TiSix or CoSix.

* * * * *